United States Patent
Son (10) Patent No.: US 12,219,811 B2
(45) Date of Patent: Feb. 4, 2025

(54) DISPLAY DEVICE HAVING A SEPARATION STRUCTURE TO DISCONNECT A LIGHT EMITTING LAYER

(71) Applicant: LG Display Co., Ltd., Seoul (KR)

(72) Inventor: KyungMo Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/554,888

(22) Filed: Dec. 17, 2021

(65) Prior Publication Data

US 2022/0208915 A1    Jun. 30, 2022

(30) Foreign Application Priority Data

Dec. 24, 2020   (KR) .......................... 10-2020-0183327

(51) Int. Cl.
*H10K 59/121*      (2023.01)
*H10K 59/131*      (2023.01)

(52) U.S. Cl.
CPC ....... *H10K 59/1213* (2023.02); *H10K 59/131* (2023.02)

(58) Field of Classification Search
CPC ............. H01L 27/3262; H01L 27/3276; H01L 51/5237; H01L 51/5253; H01L 29/78666; H01L 29/78675; H01L 29/66757; H01L 29/78669; H01L 29/78678; H01L 29/66765; H01L 27/1229; H01L 27/1233; H01L 27/1237; H01L 27/1251; H01L 27/1255
See application file for complete search history.

(56) References Cited

U.S. PATENT DOCUMENTS

| | | | |
|---|---|---|---|
| 10,862,068 B2 | 12/2020 | Choi et al. | |
| 2017/0148856 A1* | 5/2017 | Choi | .................... H01L 27/3258 |
| 2019/0355799 A1* | 11/2019 | Jeong | .................. H01L 27/3262 |
| 2020/0111855 A1* | 4/2020 | Bae | ...................... H01L 27/3262 |
| 2020/0119304 A1 | 4/2020 | Choi et al. | |
| 2020/0287157 A1* | 9/2020 | Seong | ................. H01L 27/3244 |
| 2021/0143370 A1 | 5/2021 | Choi et al. | |
| 2022/0045300 A1* | 2/2022 | He | ..................... H10K 59/1213 |

FOREIGN PATENT DOCUMENTS

KR    10-2020-0041420 A    4/2020

* cited by examiner

*Primary Examiner* — Nicholas J Tobergte
*Assistant Examiner* — Adin Hrnjic
(74) *Attorney, Agent, or Firm* — Fenwick & West LLP (57) ABSTRACT

A display device includes a substrate comprising a penetration area, a separation area, at least one non-display area, and a display area; a light emitting element disposed in the display area on the substrate; at least one thin film transistor provided in the display area; a separation structure located in the separation area and disconnecting an organic light emitting layer of the light emitting element; and an unevenness pattern disposed below the separation structure and overlapping with the separation structure, wherein the unevenness pattern has a width less than a width of the separation structure.

18 Claims, 8 Drawing Sheets

DISPLAY DEVICE HAVING A SEPARATION STRUCTURE TO DISCONNECT A LIGHT EMITTING LAYER

CROSS-REFERENCE TO RELATED APPLICATIONS

This application claims the benefit of and priority to Republic of Korea Patent Application No. 10-2020-0183327 filed on Dec. 24, 2020 in the Republic of Korea, the entire contents of which are hereby incorporated by reference in its entirety.

TECHNICAL FIELD

The present disclosure relates to a display device, and more particularly, to a display device including a penetration area in which a substrate hole that penetrates a substrate is disposed.

DISCUSSION OF THE RELATED ART

Recently, as our society advances toward an information-oriented society, the field of display devices for visually expressing an electrical information signal has rapidly advanced. Various display devices having excellent performance in terms of thinness, lightness, and low power consumption, are being developed correspondingly.

In general, electronic devices such as monitors, TVs, laptops, and digital cameras include a display device that implements an image. For example, the display device may include light emitting elements. Each light emitting element can emit light having a specific color. For example, each light emitting element may include a light emitting layer located between a first electrode and a second electrode.

The display device may have peripheral devices that are built therein, such as a camera, a speaker, and a sensor. For example, the display device may include a substrate hole that penetrates an element substrate supporting the light emitting elements. The substrate hole may be located between the light emitting elements. The peripheral devices may be inserted into the substrate hole.

SUMMARY

In the display device, external moisture may penetrate through the substrate hole. The external moisture penetrating through the substrate hole may move to the light emitting elements adjacent to the substrate hole through the light emitting layer. Accordingly, in the display device, the light emitting elements adjacent to the substrate hole may be damaged by external moisture that has penetrated through the substrate hole. An aspect of the present disclosure is to provide a display device capable of preventing or at least reducing damage to a light emitting element due to external moisture penetrating through a substrate hole.

Objects of the present disclosure are not limited to the above-mentioned objects, and other objects, which are not mentioned above, can be clearly understood by those skilled in the art from the following descriptions.

In one embodiment a display device comprises: a substrate comprising a penetration area, a separation area, at least one non-display area, and a display area; a light emitting element disposed in the display area on the substrate, the light emitting element including an organic light emitting layer; at least one thin film transistor disposed in the display area; a separation structure located in the separation area, the separation structure disconnecting the organic light emitting layer of the light emitting element; and an unevenness pattern disposed below the separation structure the unevenness pattern overlapping the separation structure, wherein the unevenness pattern has a width that is less than a width of the separation structure.

In one embodiment, a display device comprises: a substrate including a display area and a hole in the display area, the hole configured to house a camera; a thin film transistor in the display area; a light emitting element in the display area, the light emitting element including a first portion of a light emitting layer that is electrically connected to the thin film transistor and a second portion of the light emitting layer that is not electrically connected to the thin film transistor, the second portion of the light emitting layer closer to the hole than the first portion of the light emitting layer; and a separation structure around the hole, the separation structure electrically disconnecting the first portion of the light emitting layer from the second portion of the light emitting layer.

Other detailed matters of the exemplary embodiments are included in the detailed description and the drawings.

In a display device according to an exemplary embodiment of the present disclosure, a light emitting stack on a separation structure can be completely separated by disposing an unevenness pattern below the separation structure in a separation area of a substrate hole area. By separating the light emitting stack, which is a path through which moisture penetrates, it is possible to reduce or minimize occurrence of defects in a light emitting element of a display area due to moisture. Accordingly, reliability of the display device can be improved, so that a high-quality display device can be provided.

Since technical problems to be solved, problem-solving means, and effects described above in the specification are not intended to limit essential features of claims. Accordingly, the scope of the claims is not limited by the contents described in the specification.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element is not limited by the terms. It will be understood that when an element is described as being "connected", "coupled", or "adhered" to another element, the element may be directly connected or adhered to the other element or layer, but the other element or layer may be "disposed" between elements, or elements may be "connected", "coupled", or "adhered" to each other through the other element.

The "display device" herein may be used to encompass a display device in the narrow sense including a display panel and a driving unit for driving the display panel, such as a liquid crystal module (LCM), an organic light emitting diode (OLED) module, and a quantum dot (QD) module. In addition, the display device herein may also include an equipment display device including a complete product or a final product including LCM, OLED, QD module, or the like, for example, a notebook computer, a television, a computer monitor, an automotive display, or other displays of a vehicle, and a set electronic device or a set apparatus (set device) such as a mobile electronic device such as a smart phone or an electronic pad.

Accordingly, the display device herein may include an application product or a set apparatus such as a final product including the LCM, OLED, and QD module as well as a display device itself in the narrow sense such as LCM, OLED, and QD module.

If necessary, the LCM, OLED, and QD modules provided with the display panel, the driving unit, and the like may be expressed as a "display device" in the narrow sense, and the electronic device as the final product including the LCM, OLED, and QD modules may be expressed as a "set apparatus". For example, the display device in the narrow sense such as the LCD, OLED, and QD modules may include a display panel, and a source printed circuit board (source PCB) corresponding to a control unit for driving the display panel. In addition, in a case of the set apparatus, it may include a set PCB corresponding to a set control unit, which is electrically connected with the source PCB, so as to control the entire set apparatus.

A display panel applied to exemplary embodiments of the present disclosure may use any type of display panel, such as a liquid crystal display panel, an organic light emitting diode (OLED) display panel, a quantum dot (QD) display panel, and an electroluminescent display panel. The display panel of the present embodiment is not limited to a specific display panel including a flexible substrate for OLED display panel and a back plate support structure under the substrate and capable of bending a bezel. Further, the display panel applied to the display device according to an exemplary embodiment of the present disclosure is not limited to a shape or a size thereof.

More specifically, if the display panel is the OLED display panel, the display panel may include a plurality of gate lines, a plurality of data lines, and a plurality of pixels respectively formed in intersections of the gate lines and the data lines. In addition, the display panel may include an array including a thin film transistor configured to selectively apply a voltage to each of the pixels, an OLED layer on the array, an encapsulation substrate or an encapsulation layer disposed on the array to cover the OLED layer, and the like. The encapsulation layer may protect the thin film transistor and the OLED layer against external impacts and suppress permeation of moisture and oxygen into the OLED layer. In addition, a layer formed on the array may include an inorganic light emitting layer, such as a nano-sized material layer or a quantum dot.

Figure 1:
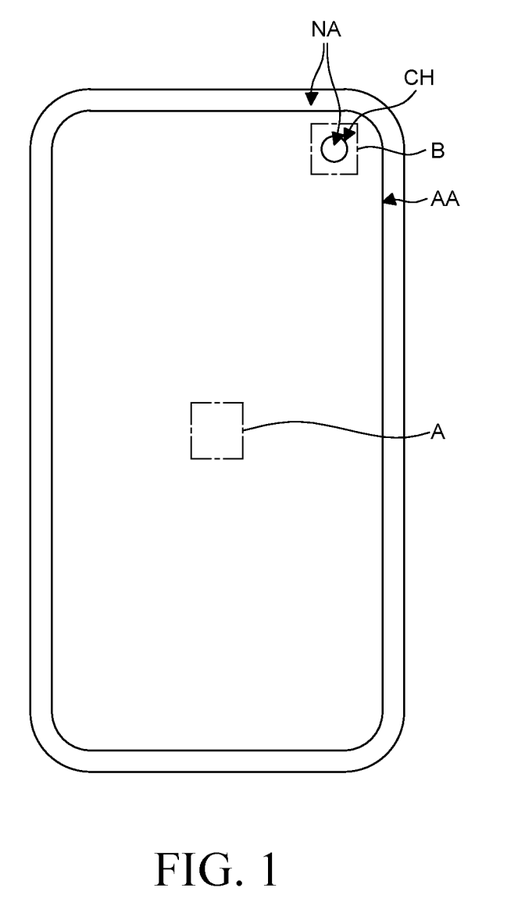
FIG. 1 is a view schematically illustrating a display device according to an exemplary embodiment of the present disclosure, and is a view illustrating a front surface of a display panel according to an exemplary embodiment of the present disclosure.

FIG. 1 herein illustrates an exemplary organic electroluminescent display (OLED) panel 100 that may be incorporated into display devices.

FIG. 1 is a plan view of the display panel 100 according to an exemplary embodiment of the present disclosure. FIG. 1 illustrates an exemplary organic electroluminescent display (OLED) panel 100 that may be incorporated into display devices. Referring to FIG. 1, in the organic electroluminescent display (OLED) panel 100, a hole CH of a camera and a sensor is disposed inside the display area DA, so that a bezel area of a non-display area can be reduced and the display area DA can be increased or maximized A product with a design that increases or maximizes the display area DA may increase or maximize a user's screen immersion and thus, may be more preferred, aesthetically.

The hole CH of the camera and the sensor may be one hole as shown in FIG. 1, but is not limited thereto, and may be variously disposed. For example, one or two holes may be disposed inside the display area DA, and a camera may be disposed in a first hole, and a distance detection sensor or a face recognition sensor and a wide-angle camera may be disposed in a second hole.

Figure 2:
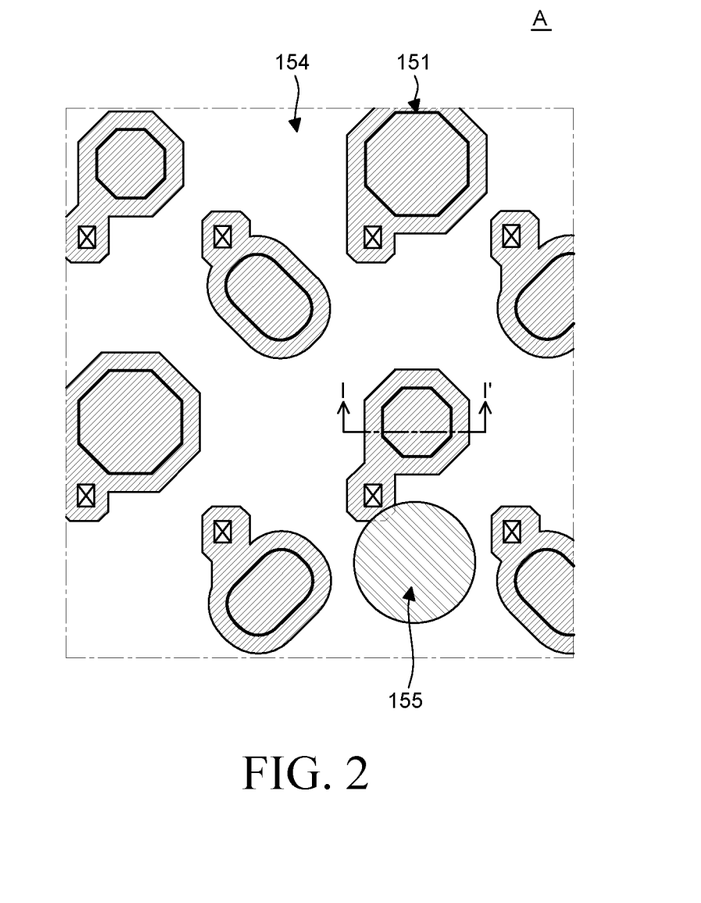
FIG. 2 is a plan view illustrating a portion of a display area by enlarging area A of FIG. 1 according to an exemplary embodiment of the present disclosure.

FIG. 2 is an enlarged view of area A, which is a part of the display area DA of the display panel 100 of FIG. 1, and illustrates a planar shape of sub-pixels disposed in the display area DA according to one embodiment.

In FIG. 2, a plurality of anode electrodes 151 are disposed in the display area DA, and a bank 154 may be filled in an area between the anode electrode 151 and another anode electrode 151. The bank 154 may be disposed to cover an edge of the anode electrode 151 and may allow only a central area of the anode electrode 151 to be in contact with an organic light emitting stack, thereby serving to define a light emitting area of the sub-pixel. A spacer 155 may be disposed in a portion of an area where the bank 154 is disposed. The spacer 155 may be disposed to have a constant density in the overall display panel 100. The spacer 155 may serve to support a mask so that a deposition mask which covers or opens an organic layer in each sub-pixel does not directly contact the display panel 100 when a deposition process is performed to form the organic light emitting stack. Although FIG. 2 exemplifies a pentile type planar structure in which the sub-pixels are disposed in dot shapes, the present disclosure is not limited thereto, and other planar structure such as a real RGB type planar structure may also be used.

Figure 3:
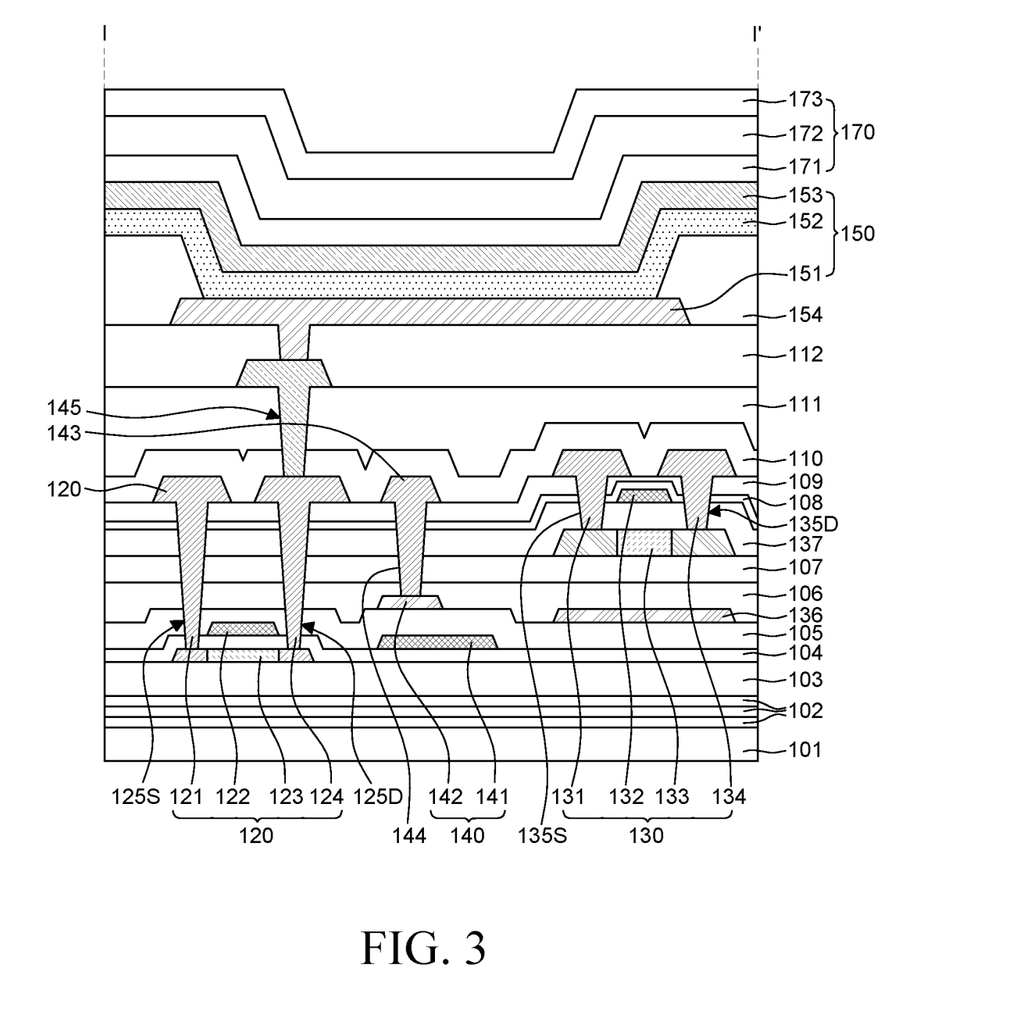
FIG. 3 is a cross-sectional view of a sub-pixel taken along line I-I' of FIG. 2 according to an exemplary embodiment of the present disclosure.

FIG. 3 shows a cross-sectional structure of the sub-pixel of line I-I' of FIG. 2 according to one embodiment.

Referring to FIG. 3, a substrate 101, a multi-buffer layer 102, and a lower buffer layer 103 may be provided, and a first thin film transistor 120 may be disposed on the lower buffer layer 103. The first thin film transistor 120 is constituting of a first semiconductor layer 123 and a first gate electrode 122, and a lower gate insulating layer 104 may be disposed on the first semiconductor layer 123 for insulating the first semiconductor layer 123 and the first gate electrode 122. A first lower interlayer insulating layer 105 and a second lower interlayer insulating layer 106 may be sequentially disposed on the first gate electrode 122, and an upper buffer layer 107 may be disposed on the second lower interlayer insulating layer 106.

The multi-buffer layer 102 may delay diffusion of moisture or oxygen penetrating into the substrate 101, and may be formed by alternately stacking silicon nitride (SiNx) and silicon oxide (SiOx) at least once.

The lower buffer layer 103 protects the first semiconductor layer 123 and blocks various types of defects introduced from the substrate. The lower buffer layer 103 may be formed of a-Si, silicon nitride (SiNx), or silicon oxide (SiOx).

The first semiconductor layer 123 of the first thin film transistor 120 may be formed of a polycrystalline semiconductor material and formed as a polycrystalline semiconductor layer, and the first semiconductor layer 123 may include a channel region, a source region, and a drain region.

Since the polycrystalline semiconductor layer has a higher mobility as compared to an amorphous semiconductor layer and an oxide semiconductor layer, it has low energy consumption and excellent reliability. Due to these advantages, the polycrystalline semiconductor layer may be used for a driving transistor.

The first gate electrode 122 may be disposed on the lower gate insulating layer 104, and may be disposed to overlap the first semiconductor layer 123.

A second thin film transistor 130 may be disposed on the upper buffer layer 107 and a light blocking layer 136 may be disposed below an area corresponding to the second thin film transistor 130. Referring to FIG. 3, the light blocking layer 136 is disposed on the first lower interlayer insulating layer 105 in the area corresponding to the second thin film transistor 130, and a second semiconductor layer 133 of the second thin film transistor 130 may be disposed on the second lower interlayer insulating layer 106 and the upper buffer layer 107 to cover the light blocking layer 136. An upper gate insulating layer 137 for insulating a second gate electrode 132 and the second semiconductor layer 133 may be disposed on the second semiconductor layer 133, and then, a first upper interlayer insulating layer 108 may be disposed on the second gate electrode 132. A second upper interlayer insulating layer 109 may be disposed on the first upper interlayer insulating layer 108. The first gate electrode 122 and the second gate electrode 132 may be a single layer or multilayers formed of any one of molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

The first and second lower interlayer insulating layers 105 and 106 may be formed of an inorganic layer having a higher hydrogen particle content as compared to the first upper interlayer insulating layer 108. For example, the first and second lower interlayer insulating layers 105 and 106 may be formed of silicon nitride (SiNx) that is formed by a deposition process using $NH_3$ gas, and the first upper interlayer insulating layer 108 may be formed of silicon oxide (SiOx). Hydrogen particles included in the first and second lower interlayer insulating layers 105 and 106 may be diffused into the polycrystalline semiconductor layer during a hydrogenation process to fill voids in the polycrystalline semiconductor layer with hydrogen. Accordingly, the polycrystalline semiconductor layer may be stabilized, thereby preventing or at least reducing deterioration of characteristics of the first thin film transistor 120. After an activation and hydrogenation process of the first semiconductor layer 123 of the first thin film transistor 120, the second semiconductor layer 133 of the second thin film transistor 130 may be formed, and in this case, the second semiconductor layer 133 may be formed of an oxide semiconductor. Since the second semiconductor layer 133 is not exposed to a high-temperature atmosphere of the activation and hydrogenation process of the first semiconductor layer 123, damage to the second semiconductor layer 133 can be prevented and reliability can be improved. The second upper interlayer insulating layer 109 may be located on the first upper interlayer insulating layer 108. The second upper interlayer insulating layer 109 may include an insulating material. The second upper interlayer insulating layer 109 may include a material different from that of the first upper interlayer insulating layer 108. For example, the second upper interlayer insulating layer 109 may include a silicon nitride-based (SiNx) material. After the first upper interlayer insulating layer 108 and the second upper interlayer insulating layer 109 are disposed, a first source contact hole 125S and a first drain contact hole 125D may be formed to correspond to a source region and a drain region of the first thin film transistor 120, and a second source contact hole 135S and a second drain contact hole 135D may be formed to correspond to a source region and a drain region of the second thin film transistor 130. Referring to FIG. 3, the first source contact hole 125S and the first drain contact hole 125D are formed such that holes may be continuously formed from the second upper interlayer insulating layer 109 to the lower gate insulating layer 104. In addition, in the second thin film transistor 130, the second source contact hole 135S and the second drain contact hole 135D may also be formed. A first source electrode 121 and a first drain electrode 124 corresponding to the first thin film transistor 120, and a second source electrode 131 and a second drain electrode 134 corresponding to the second thin film transistor 130 may be simultaneously formed, so that the number of processes for forming the source and drain electrodes of each of the first thin film transistor 120 and the second thin film transistor 130 can be reduced.

The first source and drain electrodes 121 and 124 and the second source and drain electrodes 131 and 134 may be a single layer or multilayers formed of any one of molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

A storage capacitor 140 may be disposed between the first thin film transistor 120 and the second thin film transistor 130. As shown in FIG. 3, the storage capacitor 140 may be formed by overlapping a storage lower electrode 141 and a storage upper electrode 142 with the first lower interlayer insulating layer 105 interposed therebetween.

The storage lower electrode 141 is located on the lower gate insulating layer 104, and may be formed on the same layer and formed of the same material as the first gate electrode 122. The storage upper electrode 142 may be electrically connected to a pixel circuit through a storage supply line 143. The storage upper electrode 142 may be formed of the same material as the light blocking layer 136. The storage upper electrode 142 is exposed through a storage contact hole 144 that penetrates the second lower interlayer insulating layer 106, the upper buffer layer 107, the upper gate insulating layer 137, the first upper interlayer insulating layer 108, and second upper interlayer insulating layer 109, and is connected to the storage supply line 143. For another example, although the storage upper electrode 142 is spaced apart from the light blocking layer 136 as shown in FIG. 3, they may be formed as an integrated body in which they are connected to each other. The storage supply line 143 may be formed on the same layer and formed of the same material as the first source and drain electrodes 121 and 124 and the second source and drain electrodes 131 and 134, so that the storage supply line 143 can be simultaneously formed by the same mask process as the first source and drain electrodes 121 and 124 and the second source and drain electrodes 131 and 134.

By depositing an inorganic insulating material such as SiNx or SiOx on the substrate 101 on which the first source and drain electrodes 121 and 124, the second source and drain electrodes 131 and 134, and the storage supply line 143 are formed, a passivation layer 110 may be formed. A first planarization layer 111 may be formed on the substrate 101 on which the passivation layer 110 is formed. Specifically, the first planarization layer 111 may be disposed by applying an organic insulating material such as an acrylic resin to an entire surface of the substrate 101 on which the passivation layer 110 is formed.

The passivation layer 110 and the first planarization layer 111 are disposed, and a contact hole exposing the first source electrode 121 or the first drain electrode 124 of the first thin film transistor 120 may be formed through a photolithography process. As shown in FIG. 3, a connection electrode 145 that is formed of a material formed of Mo, Ti, Cu, Al, Nd, Ni or Cr or an alloy thereof may be disposed in an area of the contact hole exposing the first drain electrode 124.

A second planarization layer 112 may be disposed on the connection electrode 145, and a contact hole for exposing the connection electrode 145 is formed in the second planarization layer 112, so that the light emitting element 150 that is connected to the first thin film transistor 120 may be disposed.

The light emitting element 150 may include the anode electrode 151 that is connected to the first drain electrode 124 of the first thin film transistor 120, at least one light emitting stack 152 that is formed on the anode electrode 151, and a cathode electrode 153 formed on the light emitting stack 152.

The light emitting stack 152 may include a hole injection layer, a hole transport layer, a light emitting layer, an electron transport layer, and an electron injection layer, and in a tandem structure in which a plurality of light emitting layers are overlapped, a charge generation layer may be additionally disposed between the light emitting layer and the light emitting layer. In the case of the light emitting layers, they may emit different colors in the respective sub-pixels. For example, a red light emitting layer, a green light emitting layer, and a blue light emitting layer may be separately formed for each sub-pixel. However, a common light emitting layer is formed to emit white light without color discrimination for each pixel, and a color filter for distinguishing colors may be separately provided. Except that individual light emitting layers are formed, the light emitting stack 152 is generally provided as a common layer and may be equally disposed in each sub-pixel.

The anode electrode 151 may be connected to the connection electrode 145 exposed through the contact hole penetrating the second planarization layer 112. The anode electrode 151 may be formed in a multilayer structure including a transparent conductive layer and an opaque conductive layer having high reflective efficiency. The transparent conductive layer is formed of a material having a relatively large work function value, such as indium-tin-oxide (ITO) or indium-zinc-oxide (IZO), and the opaque conductive layer is formed of a single-layer or multilayer structure containing Al, Ag, Cu, Pb, Mo or Ti, or an alloy thereof. For example, the anode electrode 151 may be formed in a structure in which a transparent conductive layer, an opaque conductive layer, and a transparent conductive layer are sequentially stacked, or in a structure in which a transparent conductive layer and an opaque conductive layer are sequentially stacked. The anode electrode 151 is disposed on the second planarization layer 112 to overlap the light emitting area provided by the bank 154 as well as a pixel circuit area in which the first and second thin film transistors 120 and 130 and the storage capacitor 140 are disposed, thereby allowing for an increase in light emitting area.

The light emitting stack 152 may be formed by stacking a hole transport layer, an organic light emitting layer, and an electron transport layer on the anode electrode 151 in the order or in a reverse order. In addition, the light emitting stack 152 may further include first and second light emitting stacks facing each other with a charge generation layer therebetween.

The bank 154 may be formed to expose the anode electrode 151. The bank 154 may be formed of an organic material such as photoacrylic, and may be formed of a translucent material, but it is not limited thereto and may be formed of an opaque material to prevent light interference between sub-pixels.

The cathode electrode 153 may be formed on an upper surface of the light emitting stack 152 to face the anode electrode 151 with the light emitting stack 152 interposed therebetween. When the cathode electrode 153 is applied to a top emission type organic light emitting display device, a transparent conduction layer may be formed by thinly forming indium-tin-oxide (ITO), indium-zinc-oxide (IZO), or magnesium-silver (Mg—Ag).

In order to prevent or at least reduce oxidation of a light emitting material and an electrode material, an encapsulation layer 170 that prevents or at least reduces penetration of oxygen and moisture from the outside may be disposed on the cathode electrode 153. When the light emitting stack 152 is exposed to moisture or oxygen, a pixel shrinkage phenomenon in which the light emitting area is reduced or a dark spot may occur in the light emitting area. The encapsulation layer 170 may be formed of an inorganic layer formed of glass, metal, or an aluminum oxide (AlOx) or silicon (Si)-based material, or may have a structure in which an organic layer and an inorganic layer are alternately stacked. In this case, first and second inorganic insulating layers 171 and 173 serve to block or at least reduce penetration of moisture or oxygen, and an organic layer 172 serves to planarize surfaces of the first and second inorganic insulating layers 171 and 173. The organic layer 172 may be referred to as a foreign material compensation layer. When an encapsulation layer is formed as a multilayered thin film, a movement path of moisture or oxygen is longer and more complicated as compared to a case in which the encapsulation layer is formed as a single layer, making it difficult for moisture/oxygen to penetrate to an organic light emitting element.

A barrier film may be located on the encapsulation layer 170 and encapsulate the entirety of the substrate 101. The barrier film may be a retardation film or a photoisotropic film. In this case, an adhesive layer may be located between the barrier film and the encapsulation layer 170. The adhesive layer bonds the encapsulation layer 170 and the barrier film. The adhesive layer may be a heat-curable adhesive or a naturally-curable adhesive. For example, the adhesive layer may be formed of a material such as a barrier pressure sensitive adhesive (B-PSA).

It is to be noted that the structure of the sub-pixel shown in FIG. 3 is for illustrative purpose only, and embodiments of the present disclosure is not limited thereto. For example, the first thin film transistor 120 and the second thin film transistor 130 may be formed on a same plane and have same semiconductor layer. In this case, the upper buffer layer 107, the upper gate insulating layer 137 and/or the first upper interlayer insulating layer 108 may be omitted.

Figure 4:
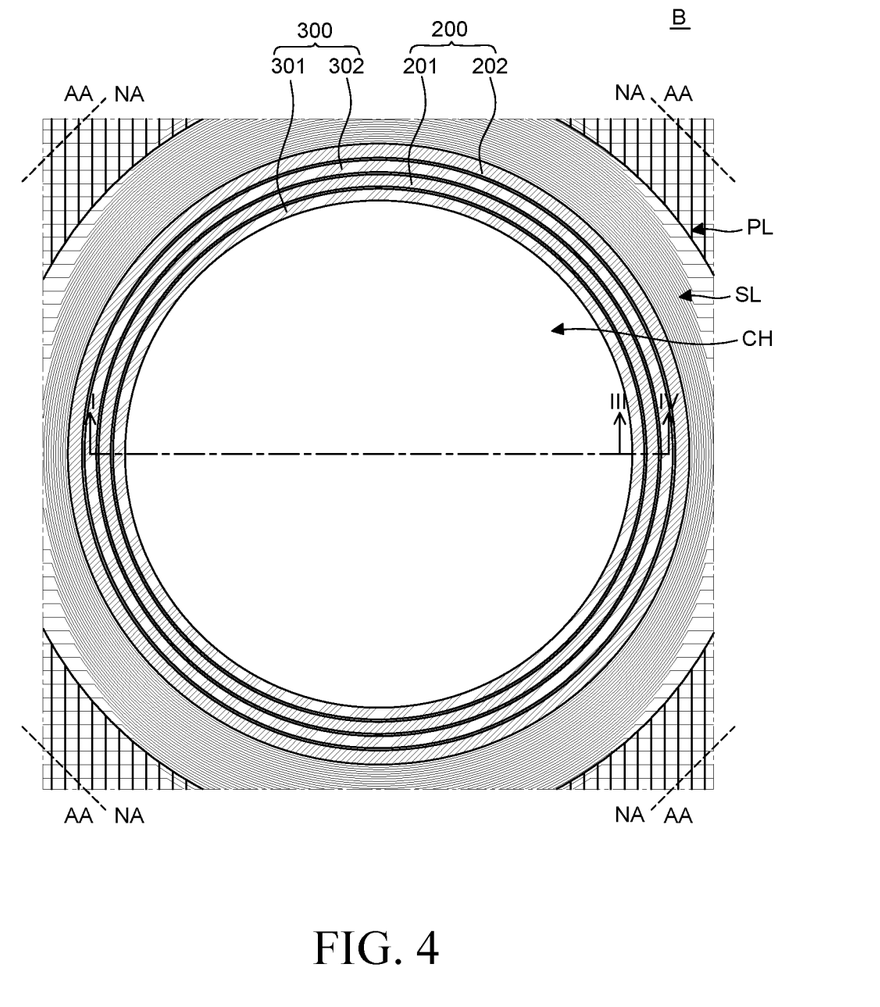
FIG. 4 is a plan view of a camera hole shown by enlarging area B of FIG. 1 according to an exemplary embodiment of the present disclosure.

FIG. 4 is an enlarged plan view of area B corresponding to an area of the camera hole CH (hereinafter, referred as to "camera hole CH area") of FIG. 1. Referring to FIG. 4, there is a large circular space in a center, and a camera module may be disposed therein. The camera hole CH area may be removed with a laser in a panel completion stage. Accordingly, in the camera hole CH area, the substrate 101 may be removed except for a part of the camera hole CH area. The non-display area NA may be disposed between the camera hole CH area and the display area AA. A dam structure 300 and a separation structure 200 may be disposed in the non-display area NA around the camera hole CH area. Referring to FIG. 4, the dam structure 300 may be configured of a first dam 301 and a second dam 302, and the separation structure 200 may be configured of a first separation unit 201 and a second separation unit 202. The first dam 301, the first separation unit 201, the second dam 302, and the second separation unit 202 may be sequentially disposed around the camera hole CH area. In general, a dam structure prevents or at least reduces the foreign material compensation layer 172 (e.g., organic layer 172), which is a part of the encapsulation layer 170, from flowing down to an end of an outer portion of the display panel 100 at the outer portion of the display panel 100, and thus, it may be used to maintain adhesion between an upper substrate and a lower substrate constituting the display panel 100. The dam structure 300 around the camera hole CH area may be formed of a plurality of structures such as the first dam 301 and the second dam 302 to protect the light emitting element 150, for example, to prevent the foreign material compensation layer 172 of the encapsulation layer 170 from being introduced or leaking to the camera hole CH area. Although the present disclosure has proposed two dams, the present disclosure is not limited thereto, and an additional dam arrangement may be possible depending on the arrangement of space. Referring to FIG. 4, the first separation unit 201 may be disposed on an inside of the first dam 301, and the second separation unit 202 may be disposed on an inside of the second dam 302. The first separation unit 201 and the second separation unit 202 may be disposed to protect the light emitting element 150 of the display area from moisture or oxygen that may be introduced from the camera hole CH area. The light emitting stack 152 for the light emitting element 150 may be deposited on a front surface of the display panel 100, and may also be uniformly deposited on the camera hole CH area. The light emitting stack 152 may transfer moisture and oxygen to the light emitting element 150 of the display area AA because the light emitting stack 152 has high reactivity and propagation properties to moisture and oxygen due to characteristics of the organic material. To prevent this, the first and second separation units 201 and 202 may allow the light emitting stack 152 to be partially separated. A detailed description thereof will be described with reference to FIGS. 6 to 8 to be described later. This specification describes two separate structures, but is not limited thereto.

In the non-display area NA near the camera hole CH area, various lines in addition to the dam structure 300 and the separation structure 200 may be disposed. Due to the arrangement of the camera hole CH area, the light emitting element 150 and the pixel circuit in an area corresponding thereto are removed, but the light emitting elements 150 and the pixel circuits disposed at a top side, a bottom side, a left side, and a right side of the camera hole CH area should be electrically connected. To this end, in the non-display area NA near the camera hole CH area, high potential power lines PL and gate lines SL may be disposed to bypass the camera hole CH area and be connected vertically and horizontally.

Figure 5:
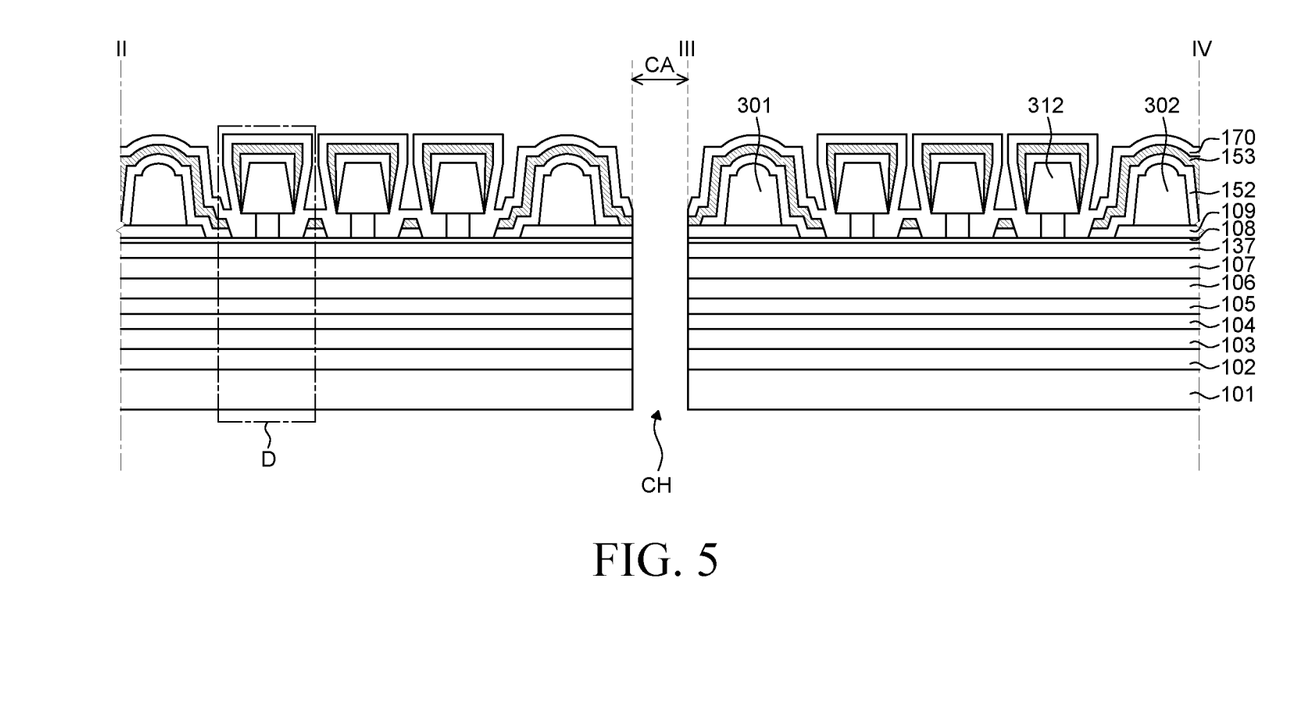
FIG. 5 is a cross-sectional view of an area of the camera hole taken along line II-IV of FIG. 4 according to an exemplary embodiment of the present disclosure.

FIG. 5 is a cross-sectional view illustrating a structure of line II-IV of FIG. 4 according to one embodiment. The first dam 301 and the second dam 302 are disposed in a closed-circuit form around the camera hole CH area, and the first separation unit 201 may be disposed in a closed-circuit form between the first dam 301 and the second dam 302. When looking at a cross-section near the camera hole CH area, the substrate 101 and various insulating layers present in the display area AA may be disposed. For example, the multi-buffer layer 102, the lower buffer layer 103, the lower gate insulating layer 104, the first lower interlayer insulating layer 105, the second lower interlayer insulating layer 106, the upper buffer layer 107, the upper gate insulating layer 137, the first upper interlayer insulating layer 108, and the second upper interlayer insulating layer 109 may be sequentially stacked on the substrate 101. The camera hole CH area may vary depending on a size of a camera to be applied to a product, and although the corresponding area is shown as an empty space, some insulating layers or line structures may be disposed therein. However, when the camera hole CH area is removed with a laser, since it is a dummy area that does not remain in a finished product, a separate expression is omitted. The laser may be irradiated in a circular or elliptical shape along a shape of the camera hole CH area, and all areas of an upper portion of the substrate, including the substrate 101 may be removed through laser irradiation. There may be a difference between an actual camera hole CH area and a laser irradiation area, for example, the laser irradiation area may be an area that is an inside of about 100 μm inwardly from the camera hole CH area. In this way, when there is a difference between the laser irradiation area and the camera hole CH area, the insulating layer of the camera hole CH area may not be damaged during laser irradiation. The laser may be a picosecond laser or a femtosecond laser, but is not limited thereto. A laser uses light that is induced and emitted through amplifying light generated by applying energy to a specific material. The laser has the same characteristics as electromagnetic waves and has directivity to monochromatic light, so it is used for communication, medical, and industrial purposes. If a laser is used, a pattern can be formed on a desired region or a specific region can be easily removed. The picosecond laser and femtosecond laser described above can be classified based on an irradiation time of the laser. Picosecond and femtosecond are units of time. Picosecond is one trillionth of a second ($10^{-12}$ sec) and femtosecond is 1000 trillionths of a second ($10^{-15}$ sec), which are very short periods of time that are difficult for humans to perceive. The reason for classifying lasers into units of time is that an irradiation time of one pulse of a picosecond laser is one trillionth of a second, and an irradiation time of one pulse of a femtosecond laser is 1000 trillionths of a second. A laser uses energy to form or remove a pattern, and when laser energy is irradiated to a subject, thermal energy melts the subject to form a pattern. As the pulse is irradiated for a longer time, a thermal effect transferred to the vicinity of a portion where the pattern is formed may occur. This thermal effect may result in heat accumulation around the laser irradiation area of the subject, and may be burned or deformed by heat up to a larger adjacent area than a set pattern. Due to these characteristics of the laser, if the area to which the laser is irradiated overlaps or is adjacent to the insulating layer, the thermal energy of the laser may also cause deformation of the insulating layer. Cracks may occur due to deformation of the insulating layer, and the cracks may propagate through the insulating layer to cause delamination or penetration of moisture and oxygen. For example, in order to prevent deformation to or delamination of the insulating layers such as the multi-buffer layer 102, the lower buffer layer 103, the first lower interlayer insulating layer 105, the second lower interlayer insulating layer 106, the upper buffer layer 107, the first upper interlayer insulating layer 108, and the second upper interlayer insulating layer 109, all of the insulating layers may be removed at a distance of about 100 μm from a laser irradiation position. Referring to FIG. 5, the first dam 301 and the second dam 302 may have an overall width of about 50 μm, and may have a hat structure in which left and right side surfaces have a gentle slope, but a central region has a steep slope. For example, the width of the dam may be about 30 to 60 μm, but is not limited thereto. In this case, the width of the central region having a steep slope may be about 25 μm, but is not limited thereto. The first dam 301 and the second dam 302 may be formed by stacking the second planarization layer 112, the bank 154, and the spacer 155, but is not limited thereto, and it may further include the first planarization layer 111 or may be disposed to include another layer.

The encapsulation layer 170 may be disposed on an area in which the first and second dams 301 and 302 and the first separation unit 201 are disposed in the same manner as in the display area AA, and may include the first inorganic insulating layer 171, the foreign material compensation layer 172, and the second inorganic insulating layer 173. However, the foreign material compensation layer 172 may be present only in a part of the area adjacent to the second dam 302, and may not be disposed up to an area of the first dam 301.

Figure 6:
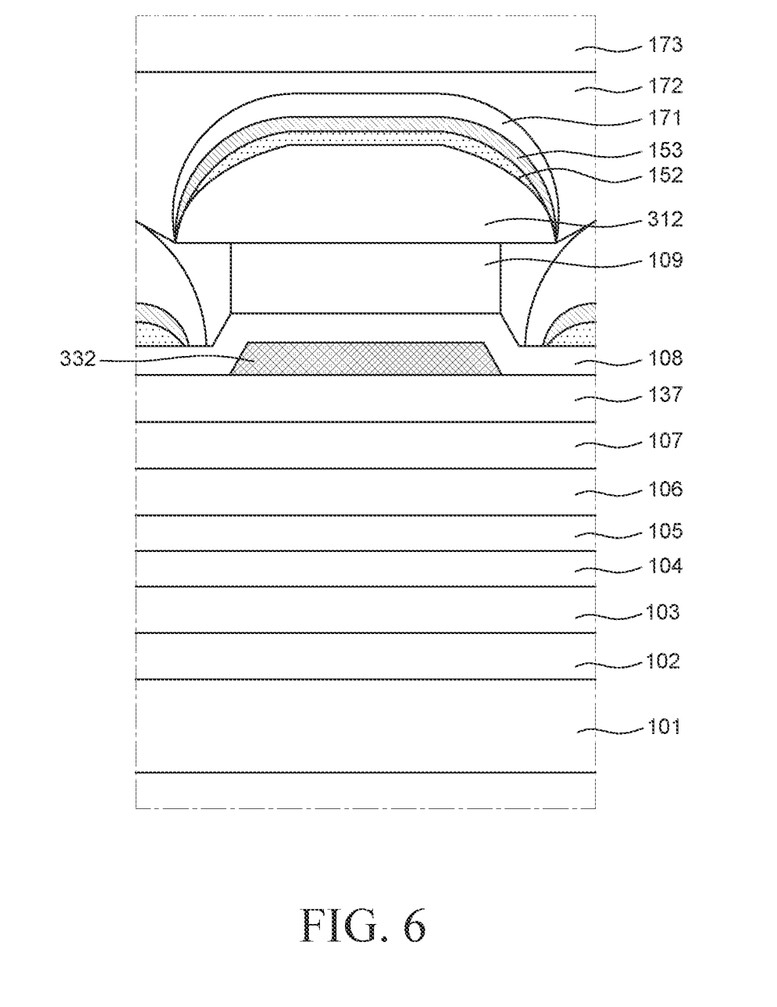
FIG. 6 is a cross-sectional view illustrating a portion of the display device, and is an enlarged view of area D of FIG. 5 according to an exemplary embodiment of the present disclosure.

FIG. 6 is a cross-sectional view illustrating a portion of the display device according to an exemplary embodiment of the present disclosure, and is an enlarged view of area D of FIG. 5.

Referring to FIG. 6, a separation area may be located between the display area and a penetration area in which the camera is located. A separation structure 312 may be located in the separation area.

The separation structure 312 is provided to disconnect the light emitting stack 152. The separation structure 312 disconnects the light emitting stack 152 into a first part of the light emitting stack 152 and a second part of the light emitting stack 152 where the second part of the light emitting stack is closer to the hole CH than the first part of the light emitting stack 152. The first part of the light emitting stack 152 is still electrically connected to the thin film transistor 120 while the second part of the light emitting stack 152 is not electrically connected to the thin film transistor 120 This is because, when the light emitting stack 152 is exposed to the outside, it may become a penetration path for moisture. Since the light emitting stack 152 may be exposed to the outside in the separation area, the separation structure 312 is required. Since the second part of the light emitting stack is disconnected from the first part of the light emitting stack, any penetration of moisture into the second part of the light emitting stack that is closer to the hole CH does not propagate to the first part of the light emitting stack 152.

The separation structure 312 may be formed of the same material as the second planarization layer 112 for planarizing an upper portion of the second thin film transistor 130. For example, the separation structure 312 may be formed in a columnar shape with the second planarization layer 112 on the second upper interlayer insulating layer 109. Then, the second upper interlayer insulating layer 109 under an outer portion of the separation structure 312 may be removed. A removal process may be performed by a dry etching process or a wet etching process.

When the second upper interlayer insulating layer 109 under the outer portion of the separation structure 312 is undercut so as to be removed inwardly, the layer that is deposited on the separation structure 312 (for example, the light emitting stack 152) does not completely cover a lower portion of the outer portion of the separation structure 312, and a connection thereof is broken as shown in the drawing. By using such a phenomenon, it is possible to separate a specific layer by partially removing a layer under the separation structure 312. As described above, since the light emitting stack 152 serves as a transfer path of moisture and may cause a defect in the display device, it is important to completely separate the light emitting stack 152. In order to completely separate the light emitting stack 152, as described above, an undercut needs to be implemented by partially removing the second upper interlayer insulating layer 109 under the separation structure 312. In addition, as a height of an undercut structure increases, the separation of the light emitting stack 152 may be advantageous. For example, a thickness of the second upper interlayer insulating layer 109 may be increased to increase the height of the undercut structure. However, in the display area AA, when the thickness of the second upper interlayer insulating layer 109 that is located on the second semiconductor layer 133 of the second thin film transistor 130 is formed to be large for separation of the light emitting stack 152 in the separation area, the second semiconductor layer 133 of the second thin film transistor 130 may be deteriorated. For example, when the thickness of the second upper interlayer insulating layer 109 including a silicon nitride-based (SiNx) material increase, a hydrogen particle content of the second upper interlayer insulating layer 109 increases, so that the second semiconductor layer 133 of the second thin film transistor 130 formed of an oxide semiconductor is deteriorated. Therefore, there is a limit to increasing a distance between a lower surface of the separation structure 312 and an upper surface of the first upper interlayer insulating layer 108 that is overlapping with the lower surface of the separation structure 312 but non-overlapping with the unevenness pattern 332 by increasing the thickness of the second upper interlayer insulating layer 109.

In an exemplary embodiment of the present disclosure, an unevenness pattern 332 may be disposed on a lower portion of the first upper interlayer insulating layer 108 to increase the distance between the lower surface of the separation structure 312 and the upper surface of the first upper interlayer insulating layer 108.

The unevenness pattern 332 may be located between the first upper interlayer insulating layer 108 and the upper gate insulating layer 137. The unevenness pattern 332 may be formed through the same mask process as that of the second gate electrode 132 of the second thin film transistor 130 disposed in the display area AA. For example, the unevenness pattern 332 may be formed of the same material on the same plane as the second gate electrode 132. For example, the unevenness pattern 332 may be a single layer or multi-layers formed of any one of molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

The unevenness pattern 332 may be formed to have a size corresponding to that of the second upper interlayer insulating layer 109 disposed thereabove. Since the unevenness pattern 332 functions to compensate for the thickness of the second upper interlayer insulating layer 109, the unevenness pattern 332 may have a width equal to or less than a width of the second upper interlayer insulating layer 109. For example, in one embodiment the unevenness pattern 332 is formed so as not to overlap the lower surface of the separation structure 312 that does not contact the second upper interlayer insulating layer 109. When the unevenness pattern 332 is located to overlap the lower surface of the separation structure 312 that does not contact the second upper interlayer insulating layer 109, the distance between the lower surface of the separation structure 312 and the upper surface of the first upper interlayer insulating layer 108 may not increase. For example, the unevenness pattern 332 may be disposed to overlap with the second upper interlayer insulating layer 109. When the separation structure 312 is disposed to surround the penetration area (referring to separation structure 200 shown in FIG. 4), the unevenness pattern 332 and/or the second upper interlayer insulating layer under the separation structure 312 may also be disposed to surround the penetration area accordingly.

As described above, the distance between the lower surface of the separation structure 312 and the upper surface of the first upper interlayer insulating layer 108 that is overlapping with the lower surface of the separation structure 312 but non-overlapping with the unevenness pattern 332 is increased by disposing the unevenness pattern 332 on the same plane as the second gate electrode of the second thin film transistor 130 below the separation structure 312, so that the light emitting stack 152 formed on an upper portion of the separation structure 312 can be completely disconnected. As the light emitting stack 152 is completely disconnected, a transfer path of moisture is cut off, thereby preventing or reducing defects in a display device.

Figure 7:
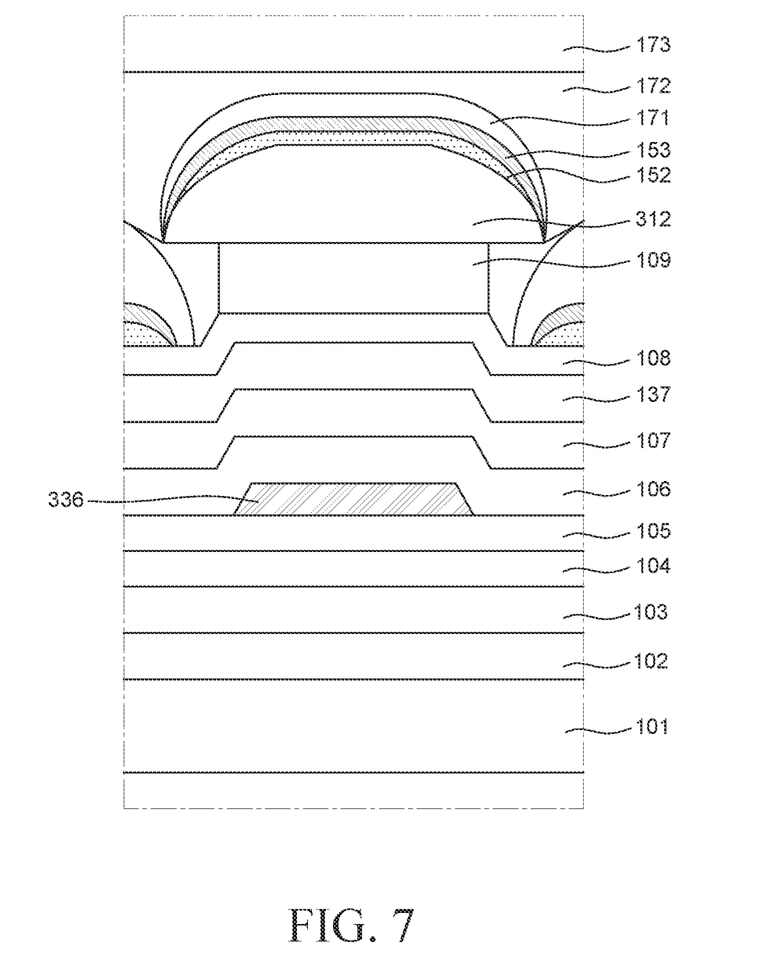
FIG. 7 is a cross-sectional view illustrating a portion of the display device, and is an enlarged view of area D of FIG. 5 according to another exemplary embodiment of the present disclosure.

FIG. 7 is a cross-sectional view illustrating a portion of the display device according to another exemplary embodiment of the present disclosure, and is an enlarged view of area D of FIG. 5.

It will be described together with reference to FIG. 6, and redundant descriptions will be omitted or briefly described. For example, the substrate 101, the multi-buffer layer 102, the lower buffer layer 103, the lower gate insulating layer 104, the first lower interlayer insulating layer 105, the second lower interlayer insulating layer 106, the upper buffer layer 107, the first upper interlayer insulating layer 108, the second upper interlayer insulating layer 109, the first planarization layer 111, the second planarization layer 112, the upper gate insulating layer 137, the light emitting stack 152, the cathode electrode 153, and the encapsulation layer 170 are substantially the same. Accordingly, redundant descriptions of configurations of FIG. 7 that are substantially the same as those of FIG. 6 will be omitted or briefly described.

Referring to FIG. 7, a display device according to another exemplary embodiment of the present disclosure may include the substrate 101, the multi-buffer layer 102, the lower buffer layer 103, the lower gate insulating layer 104, the first lower interlayer insulating layer 105, the second lower interlayer insulating layer 106, the upper buffer layer 107, the first upper interlayer insulating layer 108, the second upper interlayer insulating layer 109, the upper gate insulating layer 137, the first planarization layer 111, the second planarization layer 112, the light emitting stack 152, the cathode electrode 153, the encapsulation layer 170, and an unevenness pattern 336.

The unevenness pattern 336 may be disposed below the first upper interlayer insulating layer 108 to increase the distance between the lower surface of the separation structure 312 and the upper surface of the first upper interlayer insulating layer 108 that is overlapping with the lower surface of the separation structure 312 but non-overlapping with the unevenness pattern 336.

The unevenness pattern 336 may be located between the first lower interlayer insulating layer 105 and the second lower interlayer insulating layer 106. The unevenness pattern 336 may be formed through the same mask process as the light blocking layer 136 disposed below the second thin film transistor 130 or the upper electrode 142 of the storage capacitor 140 disposed in the display area AA. For example, the unevenness pattern 336 may be formed of the same material on the same plane as the upper electrode 142 of the storage capacitor 140 or the light blocking layer 136. For example, the uneven pattern 336 may a single layer or multilayers formed of any one of molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

The unevenness pattern 336 may be formed to have a size corresponding to that of the second upper interlayer insulating layer 109 disposed thereabove. Since the unevenness pattern 336 functions to compensate for the thickness of the second upper interlayer insulating layer 109, the unevenness pattern 336 may have a width equal to or less than the width of the second upper interlayer insulating layer 109. For example, in one embodiment the unevenness pattern 336 is formed so as not to overlap the lower surface of the separation structure 312 that does not contact the second upper interlayer insulating layer 109. When the unevenness pattern 336 is located to overlap the lower surface of the separation structure 312 that does not contact the second upper interlayer insulating layer 109, the distance between the lower surface of the separation structure 312 and the upper surface of the first upper interlayer insulating layer 108 may not increase.

As described above, the distance between the lower surface of the separation structure 312 and the upper surface of the first upper interlayer insulating layer 108 that is overlapping with the lower surface of the separation structure 312 but non-overlapping with the unevenness pattern 336 is increased by disposing the unevenness pattern 336 on the same plane as the upper electrode 142 of the storage capacitor 140 or the light blocking layer 136 below the separation structure 312, so that the light emitting stack 152 formed on an upper portion of the separation structure 312 can be completely disconnected. As the light emitting stack 152 is completely disconnected, a transfer path of moisture is cut off, thereby preventing or at least reducing defects in a display device and improving the reliability of the display device.

Figure 8:
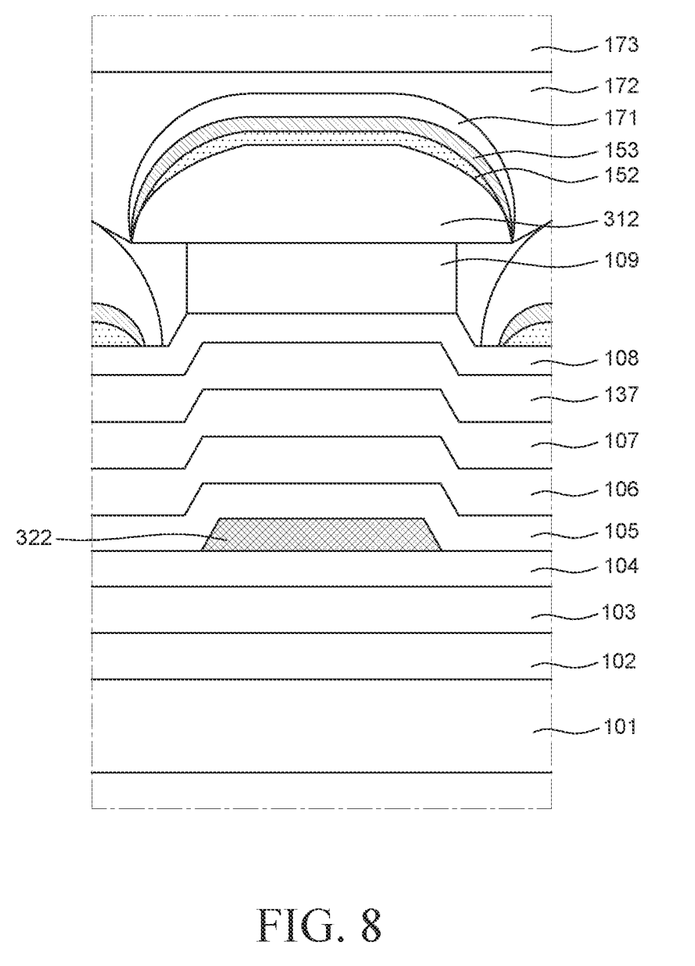
FIG. 8 is a cross-sectional view illustrating a portion of the display device and is an enlarged view of area D of FIG. 5 according to still another exemplary embodiment of the present disclosure.

FIG. 8 is a cross-sectional view illustrating a portion of the display device according to still another exemplary embodiment of the present disclosure, and is an enlarged view of area D of FIG. 5.

It will be described together with reference to FIG. 6, and redundant descriptions will be omitted or briefly described. For example, the substrate 101, the multi-buffer layer 102, the lower buffer layer 103, the lower gate insulating layer 104, the first lower interlayer insulating layer 105, the second lower interlayer insulating layer 106, the upper buffer layer 107, the first upper interlayer insulating layer 108, the second upper interlayer insulating layer 109, the first planarization layer 111, the second planarization layer 112, the upper gate insulating layer 137, the light emitting stack 152, the cathode electrode 153, and the encapsulation layer 170 are substantially the same. Accordingly, redundant descriptions of configurations of FIG. 8 that are substantially the same as those of FIG. 6 will be omitted or briefly described.

Referring to FIG. 8, a display device according to still another exemplary embodiment of the present disclosure may include the substrate 101, the multi-buffer layer 102, the lower buffer layer 103, the lower gate insulating layer 104, the first lower interlayer insulating layer 105, the second lower interlayer insulating layer 106, the upper buffer layer 107, the first upper interlayer insulating layer 108, the second upper interlayer insulating layer 109, the upper gate insulating layer 137, the first planarization layer 111, the second planarization layer 112, the light emitting stack 152, the cathode electrode 153, the encapsulation layer 170, and an unevenness pattern 322.

The unevenness pattern 322 may be disposed below the first upper interlayer insulating layer 108 to increase the distance between the lower surface of the separation structure 312 and the upper surface of the first upper interlayer insulating layer 108 that is overlapping with the lower surface of the separation structure 312 but non-overlapping with the unevenness pattern 332. The unevenness pattern 322 may be positioned between the lower gate insulating layer 104 and the first lower interlayer insulating layer 105. The unevenness pattern 322 may be formed through the same mask process as the first gate electrode 122 of the first thin film transistor 120 disposed in the display area AA. For example, the unevenness pattern 322 may be formed of the same material on the same plane as the first gate electrode 122 of the first thin film transistor 120. For example, the uneven pattern 322 may a single layer or multilayers formed of any one of molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

The unevenness pattern 322 may be formed to have a size corresponding to that of the second upper interlayer insulating layer 109 disposed thereabove. Since the unevenness pattern 322 functions to compensate for the thickness of the second upper interlayer insulating layer 109, the unevenness pattern 322 may have a width equal to or less than the width of the second upper interlayer insulating layer 109. For example, in one embodiment the unevenness pattern 322 is formed so as not to overlap the lower surface of the separation structure 312 that does not contact the second upper interlayer insulating layer 109. When the unevenness pattern 322 is located to overlap the lower surface of the separation structure 312 that does not contact the second upper interlayer insulating layer 109, the distance between the lower surface of the separation structure 312 and the upper surface of the first upper interlayer insulating layer 108 may not increase.

As described above, the distance between the lower surface of the separation structure 312 and the upper surface of the first upper interlayer insulating layer 108 that is overlapping with the lower surface of the separation structure 312 but non-overlapping with the unevenness pattern 332 is increased by disposing the unevenness pattern 322 on the same plane as the second gate electrode of the second thin film transistor 130 below the separation structure 312, so that the light emitting stack 152 formed on the upper portion of the separation structure 312 can be completely disconnected. As the light emitting stack 152 is completely separated, a transfer path of moisture is cut off, thereby preventing or at least reducing defects in a display device and improving the reliability of the display device.

The exemplary embodiments of the present disclosure can also be described as follows:

According to an aspect of the present disclosure, a display device, including a substrate in which a penetration area and a separation area are located, the substrate including at least one non-display area and a display area; a light emitting element disposed in the display area on the substrate; a first thin film transistor provided in the display area; a second thin film transistor located on the first thin film transistor; a separation structure located in the separation area and provided to disconnect an organic light emitting layer of the light emitting element; and an unevenness pattern disposed below the separation structure, wherein the unevenness pattern has a width less than a width of the separation structure.

The display device may further include a first planarization layer disposed on the second thin film transistor; and a second planarization layer on the first planarization layer.

The separation structure may be formed of the same material as the second planarization layer.

The display device may further include a first upper interlayer insulating layer disposed on a second gate electrode of the second thin film transistor and extending to the separation area; a second upper interlayer insulating layer disposed on the first upper interlayer insulating layer; and an upper gate insulating layer disposed under the second gate electrode and disposed over the second semiconductor layer of the second thin film transistor.

The unevenness pattern may be disposed between the first upper interlayer insulating layer and the upper gate insulating layer.

The unevenness pattern may be formed of the same material as the second gate electrode.

The display device may further include a lower gate insulating layer located between a first gate electrode and a first semiconductor layer of the first thin film transistor; and a first lower interlayer insulating layer covering the first gate electrode.

The unevenness pattern may be disposed between the lower gate insulating layer and the first lower interlayer insulating layer.

The unevenness pattern may be formed of the same material as the lower gate electrode.

The display device may further include a storage capacitor disposed between the first thin film transistor and the second thin film transistor and including an upper electrode and a lower electrode with the first lower interlayer insulating layer interposed therebetween.

The display device may further include a second lower interlayer insulating layer covering the upper electrode.

The unevenness pattern may be located between the first lower interlayer insulating layer and the second lower interlayer insulating layer.

The unevenness pattern may be formed of the same material as the upper electrode.

A width of the second upper interlayer insulating layer under the separation structure may be less than a width of the separation structure.

The separation structure may be located to surround the penetration area.

The display device may further include an encapsulation layer covering the display area and the separation area, and including a first inorganic insulating layer, a foreign material compensation layer, and a second inorganic insulating layer.

Although the embodiments of the present disclosure have been described in detail with reference to the accompanying drawings, it is to be understood that the present disclosure is not limited to those embodiments and various changes and modifications may be made without departing from the scope of the present disclosure. Therefore, the embodiments disclosed in the present disclosure are intended to illustrate rather than limit the scope of the present disclosure, and the scope of the technical idea of the present disclosure is not limited by these embodiments. Each of the features of the various embodiments of the present disclosure may be partially or wholly combined or combined with each other, various interlocking and driving are possible technically, and each of the embodiments may be implemented independently of each other or may be implemented together in an association relationship. The protection scope of the present disclosure should be interpreted by the following claims, and all technical ideas within the scope equivalent thereto should be construed as being included in the scope of the present disclosure.

What is claimed is:

1. A display device, comprising:
   a substrate comprising a penetration area, a separation area, at least one non-display area, and a display area;
   a light emitting element disposed in the display area on the substrate, the light emitting element including an organic light emitting layer;
   a first thin film transistor and a second thin film transistor disposed in the display area, and a first source electrode and a first drain electrode of the first thin film transistor and a second source electrode and a second drain electrode of the second thin film transistor are on a same layer;
   a first planarization layer disposed on the first source electrode and the first drain electrode of the first thin film transistor and the second source electrode and the second drain electrode of the second thin film transistor;
   a connection electrode disposed on the first planarization layer;
   a second planarization layer disposed on the first planarization layer and the connection electrode;
   a separation structure located in the separation area, the separation structure disconnecting the organic light emitting layer of the light emitting element;
   an unevenness pattern disposed below the separation structure, the unevenness pattern overlapping the separation structure, and
   one or more intermediate layers between the separation structure and the unevenness pattern and at least one of the one or more intermediate layers overlapping a side surface of the unevenness pattern, wherein a height of a first portion of an upper surface of the one or more intermediate layers that is between the separation structure and the unevenness pattern with respect to the substrate is higher than a height of a second portion of the upper surface of the one or more intermediate layers that is not between the separation structure and the unevenness pattern with respect to the substrate,
   wherein the unevenness pattern has a width that is less than a width of the separation structure,
   wherein the one or more intermediate layers are made of an insulating material, and at least one of the one or more intermediate layers is in the display area and the separation area such that the at least one or more intermediate layers extends past an end of the separation structure in the separation area,
   wherein the one or more intermediate layers include a first upper interlayer insulating layer disposed between the first thin film transistor and the second thin film transistor and extending to the separation area;
   wherein the unevenness pattern is disposed below the first upper interlayer insulating layer in the separation area.

2. The display device of claim 1, wherein the separation structure includes a same material as the second planarization layer.

3. The display device of claim 2, further comprising:
   a second upper interlayer insulating layer disposed on the first upper interlayer insulating layer; and an upper gate insulating layer disposed under a second gate electrode of the second thin film transistor and over a second semiconductor layer of the second thin film transistor, wherein the first upper interlayer insulating layer disposed on a second gate electrode of a second thin film transistor.

4. The display device of claim 3, wherein the unevenness pattern is disposed between the first upper interlayer insulating layer and the upper gate insulating layer.

5. The display device of claim 4, wherein the unevenness pattern comprises a same material as the second gate electrode.

6. The display device of claim 3, further comprising:
a lower gate insulating layer located between a first gate electrode and a first semiconductor layer of the first thin film transistor; and
a first lower interlayer insulating layer covering the first gate electrode.

7. The display device of claim 6, wherein the one or more intermediate layers includes the first lower interlayer insulating layer and the unevenness pattern is disposed between the lower gate insulating layer and the first lower interlayer insulating layer.

8. The display device of claim 7, wherein the unevenness pattern comprises a same material as the first gate electrode.

9. The display device of claim 6, further comprising:
a storage capacitor disposed between the first thin film transistor and the second thin film transistor, the storage capacitor including an upper electrode and a lower electrode with the first lower interlayer insulating layer interposed between the upper electrode and the lower electrode.

10. The display device of claim 9, further comprising:
a second lower interlayer insulating layer covering the upper electrode.

11. The display device of claim 10, wherein the one or more intermediate layers includes the second lower interlayer insulating layer and the unevenness pattern is located between the first lower interlayer insulating layer and the second lower interlayer insulating layer.

12. The display device of claim 11, wherein the unevenness pattern comprises a same material as the upper electrode.

13. The display device of claim 3, wherein a width of the second upper interlayer insulating layer under the separation structure is less than a width of the separation structure.

14. The display device of claim 13, wherein the separation structure surrounds the penetration area.

15. The display device of claim 14, further comprising:
an encapsulation layer covering the display area and the separation area, the encapsulation layer including a first inorganic insulating layer, an organic layer, and a second inorganic insulating layer.

16. A display device comprising:
a substrate including a display area, a hole in the display area, and a separation area around the hole, the hole configured to house a camera;
a first thin film transistor and a second thin film transistor in the display area, and a first source electrode and a first drain electrode of the first thin film transistor and a second source electrode and a second drain electrode of the second thin film transistor are on a same layer;
a light emitting element in the display area, the light emitting element including a first portion of a light emitting layer that is electrically connected to the first thin film transistor and a second portion of the light emitting layer that is not electrically connected to the first thin film transistor, the second portion of the light emitting layer closer to the hole than the first portion of the light emitting layer;
a separation structure in the separation area that is around the hole, the separation structure electrically disconnecting the first portion of the light emitting layer from the second portion of the light emitting layer;
a first planarization layer disposed on the first source electrode and the first drain electrode of the first thin film transistor and the second source electrode and the second drain electrode of the second thin film transistor;
a connection electrode disposed on the first planarization layer;
a second planarization layer disposed on the first planarization layer and the connection electrode;
an unevenness pattern under the separation structure and overlapping the separation structure;
one or more intermediate layers between the separation structure and the unevenness pattern and are made of an insulating material, wherein a height of a first portion of an upper surface of the one or more intermediate layers that is between the separation structure and the unevenness pattern with respect to the substrate is higher than a height of a second portion of the upper surface of the one or more intermediate layers that is not between the separation structure and the unevenness pattern with respect to the substrate; and
wherein the separation structure comprises a same material as the second planarization layer, and at least one of the one or more intermediate layers is in the display area and the separation area such that the at least one or more intermediate layers extends past an end of the separation structure in the separation area,
wherein the one or more intermediate layers include a first upper interlayer insulating layer disposed between the first thin film transistor and the second thin film transistor and extending to the separation area;
wherein the unevenness pattern is disposed below the first upper interlayer insulating layer in the separation area.

17. The display device of claim 16, wherein the unevenness pattern has a width that is less than a width of the separation structure.

18. The display device of claim 17, wherein the unevenness pattern comprises a same material as a first gate electrode of the first thin film transistor or a second gate electrode of the second thin film transistor.

* * * * *